US009846997B2

(12) United States Patent
Sah et al.

(10) Patent No.: US 9,846,997 B2
(45) Date of Patent: Dec. 19, 2017

(54) APPARATUS, METHOD AND SYSTEM FOR CHECKING REAR LAMP

(71) Applicant: Hyundai Motor Company, Seoul (KR)

(72) Inventors: Sung Jin Sah, Suwon-si (KR); Jin Ho Na, Suwon-Si (KR); Sung Min Park, Seoul (KR); Kwang Myung Oh, Daejeon (KR); Hui Sung Lee, Gunpo-si (KR)

(73) Assignee: HYUNDAI MOTOR COMPANY, Seoul (KR)

( * ) Notice: Subject to any disclaimer, the term of this patent is extended or adjusted under 35 U.S.C. 154(b) by 129 days.

(21) Appl. No.: 14/509,769

(22) Filed: Oct. 8, 2014

(65) Prior Publication Data

US 2015/0108987 A1 Apr. 23, 2015

(30) Foreign Application Priority Data

Oct. 23, 2013 (KR) .................. 10-2013-0126686

(51) Int. Cl.
*B60Q 1/54* (2006.01)
*G06F 3/045* (2006.01)
*G08B 3/10* (2006.01)
*G01R 31/00* (2006.01)

(52) U.S. Cl.
CPC ............. *G08B 3/10* (2013.01); *G01R 31/006* (2013.01)

(58) Field of Classification Search
CPC ...................................... G01R 31/08
See application file for complete search history.

(56) References Cited

U.S. PATENT DOCUMENTS

| 4,376,909 A * | 3/1983 | Tagami ............... B60Q 1/1423 |
| | | 315/82 |
| 6,462,480 B1 | 10/2002 | Tornare |
| 7,421,321 B2 * | 9/2008 | Breed .................... B60C 11/24 |
| | | 340/442 |
| 2003/0197606 A1 * | 10/2003 | Epstein .................. B60Q 1/54 |
| | | 340/466 |
| 2005/0141405 A1 | 6/2005 | Ootera et al. |
| 2009/0071255 A1 * | 3/2009 | Okuda ............... G01S 7/52004 |
| | | 73/628 |

FOREIGN PATENT DOCUMENTS

| CN | 102741919 A | 10/2012 |
| CN | 103024990 A | 4/2013 |
| JP | 2003-300453 A | 10/2003 |
| JP | 2005-196818 A | 7/2005 |
| JP | 2012-240590 A | 12/2012 |
| KR | 10-0856919 B1 | 9/2008 |

(Continued)

OTHER PUBLICATIONS

Chinese Office Action dated Sep. 5, 2017 issued in Chinese Patent Application No. 201410571670.9 (with English translation).

*Primary Examiner* — Farhana Hoque
(74) *Attorney, Agent, or Firm* — McDermott Will & Emery LLP

(57) ABSTRACT

An apparatus for checking a rear lamp includes a sensor and a controller. The sensor is disposed in at least one rear lamp and configured to obtain a first signal generated from the outside. The controller is configured to turn on the at least one rear lamp according to the first signal.

10 Claims, 4 Drawing Sheets

(56) References Cited

FOREIGN PATENT DOCUMENTS

| KR | 10-2011-0094758 A | 8/2011 |  |
|----|-------------------|--------|--|
| KR | 10-2012-0126583 A | 11/2012 |  |
| KR | 10-2013-0033086 A | 4/2013 |  |
| KR | 10-1258064 B1 | 4/2013 |  |
| KR | 101258064 B1 * | 4/2013 | ............... B60Q 1/34 |

* cited by examiner

APPARATUS, METHOD AND SYSTEM FOR CHECKING REAR LAMP

CROSS-REFERENCE TO RELATED APPLICATION

This application claims the benefit of priority to Korean Patent Application No. 10-2013-0126686, filed on Oct. 23, 2013 in the Korean Intellectual Property Office, the entire content of which is incorporated herein by reference.

TECHNICAL FIELD

The present inventive concept relates to an apparatus, method and system for checking a rear lamp of a vehicle, and more particularly, to an apparatus, a method, and a system for checking a rear lamp of a vehicle with a simple operation such as tapping the rear lamp by mounting a sensor (e.g., a sound wave sensor) to the rear lamp, so as to check an operation status of a rear lamp which would be hard for a driver to check in a conventional apparatus, method and system.

BACKGROUND

A front lamp to brighten up a road ahead of a vehicle at night is equipped on a front of a vehicle. On a rear side of the vehicle, a back lamp which is turned on when shifting into a reverse gear, a brake lamp which is turned on when a brake pedal is pressed, a rear fog lamp which is turned on by environmental factors such as fog, drizzle, and a blizzard, and an indicator lamp which is turned on when changing lane, are equipped.

In general, when the front lamp does not operate normally, since the driver may possibly check it while driving, an accident due to a breakdown of the front lamp is rare.

However, in case of the rear lamp, since it is mostly switched on and off by a driving behavior of the driver, it is difficult for the driver to determine the operation status of the rear lamp as clearly in real time as a breakdown of the front lamp.

SUMMARY

The present inventive concept has been made in view of the above problems, and provides an apparatus, method and system for checking a rear lamp by mounting a sound wave sensor on a rear lamp, and controlling turning on/off of the rear lamp with a tapping operation to the rear lamp by a driver so that the driver may check the operation status of the rear lamp which would be difficult to check directly.

The present inventive concept further provides an apparatus, method and system for checking a rear lamp that performs a user authentication prior to a check for an operation status of a rear lamp in order to prevent a battery consumption of a vehicle which is caused by anyone, other than the driver, who taps on the rear lamp to turn on the rear lamp.

One aspect of the present inventive concept relates to an apparatus for checking a rear lamp including a sensor and a controller. The sensor is disposed in at least one rear lamp and configured to obtain a first signal generated from the outside. The controller is configured to turn on the at least one rear lamp according to the first signal. The controller may turn on the rear lamp when the first signal and a pre-stored second signal are identical. The first signal and the second signal may be sound wave signals. The controller may perform a user authentication with authentication information received from the outside. The controller may complete a user authentication when user authentication information received from an electronic device and pre-stored authentication information are identical. The controller may activate a rear lamp checking mode when the user authentication is completed. The controller may store, when the second signal is not pre-stored, the first signal received from the outside as the second signal by entering into a signal storing mode.

The apparatus may include a plurality of rear lamps. The controller may change a type of lamps to be turned on, among the plurality of rear lamps, according to a type of the first signal. The controller may sequentially turn on the plurality of lamps.

Another aspect of the present inventive concept encompasses a method for checking a rear lamp including obtaining a first signal from a sensor disposed in at least one rear lamp. The at least one rear lamp is turned on according to the first signal. In the turning on of the at least one rear lamp, the first signal may be compared with a pre-stored second signal, and the rear lamp may be turned on when the first signal and the second signal are identical.

Before obtaining a first signal from a sensor, a user authentication may be completed when user authentication information received from the outside and pre-stored authentication information are identical.

After completing a user authentication, a rear lamp checking mode may be activated when the user authentication is completed.

Before comparing the first signal with a pre-stored second signal, it may be determined whether the second signal is stored, a signal storing mode may be entered into when it is determined that the second signal is not stored, and the first signal received from the sensor may be stored as the second signal.

A type of lamps to be turned on may be changed, among a plurality of rear lamps, according to a type of the first signal. The plurality of lamps may be sequentially turned on.

Still another aspect of the present inventive concept relates to a system for checking a rear lamp, including an electronic device, at least one rear lamp and a checking device. The electronic device stores user authentication information. The at least one rear lamp includes at least one sensor configured to obtain a first signal inputted from the outside. The checking device is configured to perform a user authentication by user authentication information received from the electronic device, and control turning on/off of the rear lamp when the first signal obtained from the sensor and a pre-stored second signal are identical.

Still another aspect of the present inventive concept encompasses a system for checking a rear lamp including a plurality of rear lamps and a checking device. The plurality of rear lamps include at least one sensor configured to obtain a first signal inputted from the outside. The checking device is configured to perform a user authentication by user authentication information inputted through an input, and control turning on/off of the rear lamp when the first signal received from the sensor and a pre-stored second signal are identical.

BRIEF DESCRIPTION OF THE DRAWINGS

The objects, features and advantages of the present inventive concept will be more apparent from the following detailed description in conjunction with the accompanying drawings, in which like reference characters may refer to the same or similar parts throughout the different views. The drawings are not necessarily to scale, emphasis instead being placed upon illustrating the principles of the embodiments of the inventive concept.

FIG. 1 is a block diagram illustrating a main configuration of a rear lamp checking system according to an embodiment of the present inventive concept.

DETAILED DESCRIPTION

Exemplary embodiments of the present inventive concept are described with reference to the accompanying drawings in detail. The same reference numbers are used throughout the drawings to refer to the same or like parts. Detailed descriptions of well-known functions and structures incorporated herein may be omitted to avoid obscuring the subject matter of the present inventive concept.

Figure 1:
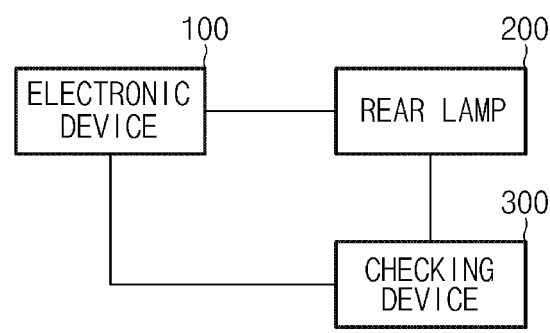
Figure 2:
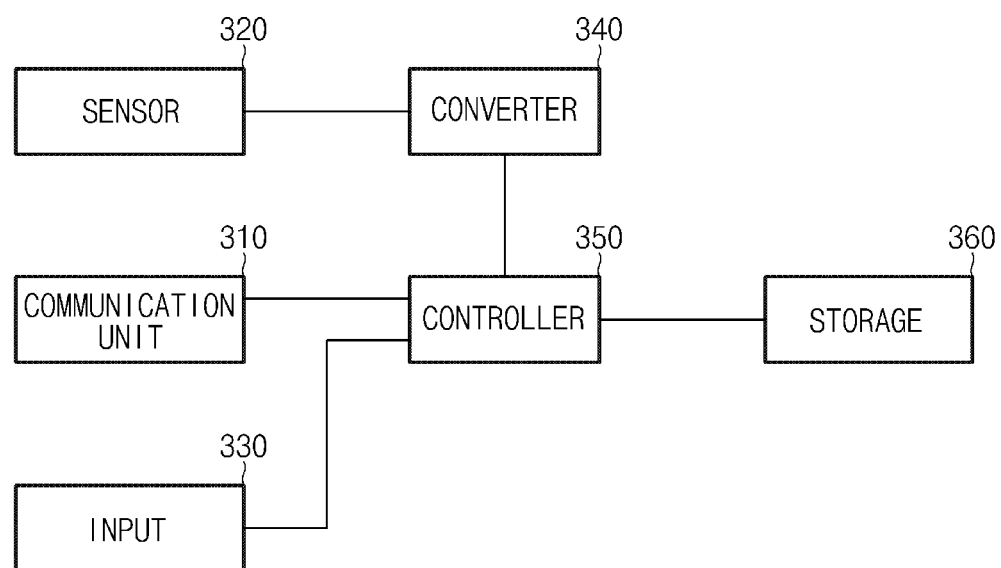
FIG. 2 is a block diagram illustrating a main configuration of a checking apparatus illustrated in FIG. 1.

FIG. 1 is a block diagram illustrating a main configuration of a rear lamp checking system according to an embodiment of the present inventive concept. FIG. 2 is a block diagram illustrating a main configuration of a checking apparatus illustrated in FIG. 1.

Referring to FIGS. 1 and 2, the rear lamp checking system 10 according to the present inventive concept may include an electronic device 100, a rear lamp 200, and a checking device 300.

The electronic device 100 may store user authentication information, and may transmit the user authentication information to the checking device 300 according to a user input. To this end, the electronic device 100 may be a device capable of performing the user authentication by performing a short range wireless communication with the checking device 300 equipped in the vehicle such as a smart key and a smart phone.

The rear lamp 200 may be a lamp equipped on a rear side of the vehicle, and may include a back lamp which is turned on when shifting into a reverse gear during driving, a brake lamp which is turned on when a brake pedal is pressed, a rear fog lamp which is turned on due to external environment factors such as fog, drizzle, and blizzard, and an indicator lamp that is turned on when changing a lane.

The checking device 300 may perform the user authentication by the user authentication information received from the external, e.g., the outside, and may control turning on/off of the rear lamp by analyzing a signal received from a sensor. To this end, the checking device 300 may include a communication unit 310, a sensor 320, a converter 340, a controller 350, and a storage 360. At this time, according to an embodiment of the present inventive concept, the signal may be a signal that is an external input transmitted through a medium, and may be a sound wave signal.

The communication unit 310 may perform a wired or a wireless communication with the electronic device 100 in order to receive the user authentication information, and may perform a Controller Area Network (CAN) for a communication of the inside of the vehicle.

The sensor 320 may be mounted on the rear lamp 200 located at a rear side of the vehicle, and may obtain a sound wave signal corresponding to a user tapping. That is, when the user taps a specific part of the rear lamp, the sound wave, such as a generated sound or a vibration, may be propagated through an internal space of the rear lamp 200, and the sensor 320 may obtain the propagated sound wave and provide the propagate sound wave to the converter 340. At this time, the sound wave sensor including the sensor 320 may be configured with a sensor that may obtain the sound wave signal, such as a piezoelectric sensor, an accelerometer sensor, and a microphone sensor, etc., and may convert the sound wave signal (hereinafter, a first sound wave signal) corresponding to the obtained sound wave into an electric signal.

The input 330 may generate an input signal according to an input from an external, e.g., the outside, and may provide the input signal to the controller 350. To this end, the input 330 may include an input device such as a general keypad, a touch pad, or a touch screen, etc. The input 330 may receive the user authentication information from the external, e.g., the outside, to activate a rear lamp checking mode, and may provide the user authentication information to the controller 350. In particular, when the input 330 is configured with a touch screen, the input 330 may also serve as the output unit.

The converter 340 may convert the electric signal converted in the sensor 230 into a digital signal, and provide the digital signal to the controller 350.

The controller 350 may complete the user authentication by comparing the user authentication information received from the electronic device 100 through the communication unit 310 or the user authentication information inputted through the input 330 with the user authentication information previously stored in the storage 360. When the user authentication is completed, the controller 350 may activate the sensor 320 by activating the rear lamp checking mode. Thus, the controller 350 may prevent a battery consumption of the vehicle that may be generated due to the turning on of the rear lamp when anyone other than the driver taps the rear lamp.

When a first sound wave signal is obtained through the sensor 320 after the rear lamp checking mode is activated, the controller 350 may check information such as a nature of a sound wave signal, number of tapping times, and a pattern, etc. by analyzing the obtained first sound wave signal. In more detail, the first sound wave signal may be converted into the electric signal in the sensor 320, and the converted electric signal may be converted into a digital signal through the converter 340. The controller 350 may check the first sound wave signal information by analyzing the converted digital signal.

When a second sound wave signal corresponding to a control signal that may perform turning on of the rear lamp 200 exists in the storage 360, the controller 350 may check whether the first sound wave signal and the second sound wave signal are identical. As a result of the check, when information of the first sound wave signal and the second wave signal are identical, the controller 350 may control the turning on/off of the rear lamp 200 by the control signal corresponding to the second sound wave signal. That is, the controller 350 may control the turning on/off of the rear lamp such as a back lamp, a brake lamp, a rear fog lamp, and an indicator lamp, etc. Thus, the driver may check that some problem has occurred in the lamp that is not turned on, and may fix it. At this time, the controller 350 may also perform the turning on for each rear lamp sequentially.

In addition, when the information of the first sound wave signal and the second sound wave signal are not identical, the controller 350 may generate a message requesting a re-input of the second sound wave signal and transmit the message to the electronic device 100, or may provide the message to the user through an output unit (not shown) of the checking device 300.

Further, when the second sound wave signal is not stored in the storage 360, the controller 350 may enter into a sound wave signal storing mode, and may store the inputted first sound wave signal as the second sound wave signal.

The storage 360 may store authentication information for the user authentication, and may store a second sound wave signal and the information such as a nature of the second sound wave signal, number of the tapping times, and a pattern, etc. In addition, the second sound wave signal and the information of the second sound wave signal may be stored in the electronic device 100 or in a separate cloud device (not shown) as well as in the storage 360, and may be obtained to use when a user requests.

Figure 3:
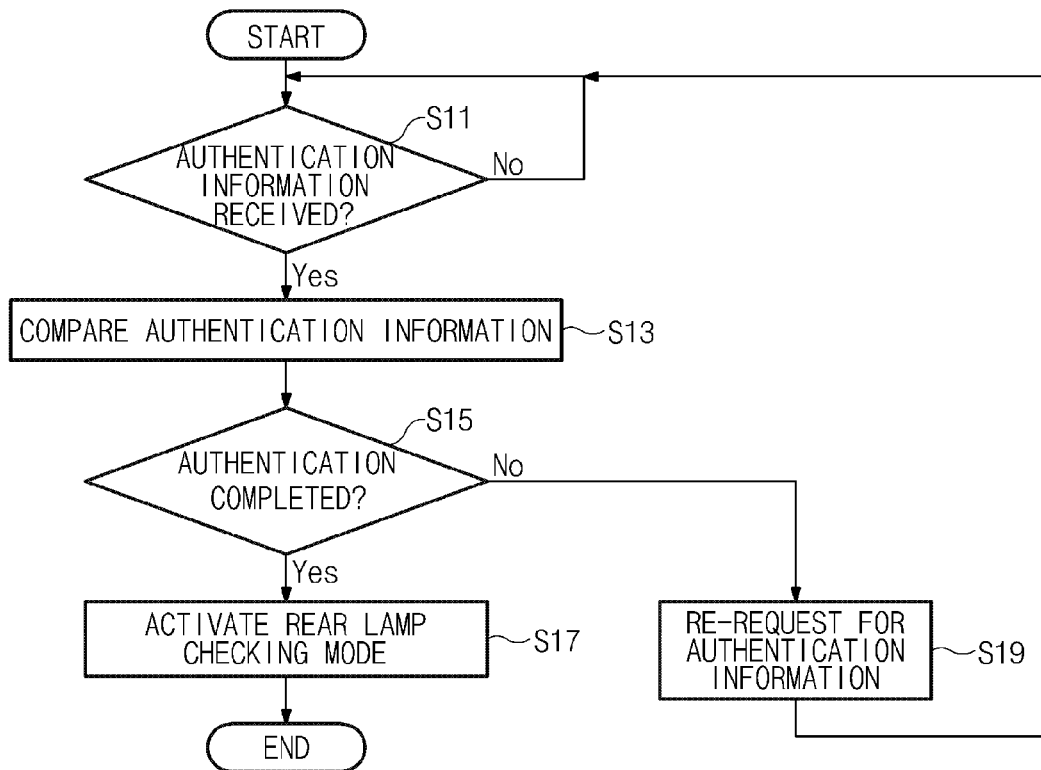
FIG. 3 is a flowchart illustrating a user authentication method according to an embodiment of the present inventive concept.

FIG. 3 is a flowchart illustrating a user authentication method according to an embodiment of the present inventive concept.

Referring to FIGS. 1 to 3, the controller 350 may check whether user authentication information is received from an external, e.g., the outside, at step S11. As a result of the check at step S11, if the user authentication information is received from the external, the controller 350 may proceed to step S13, and may wait for the reception of the authentication information when the user authentication information is not received. At this time, the user authentication information may be received through the electronic device 100 or the input 330.

The controller 350 may compare the user authentication information pre-stored in the storage 360 with the received user authentication information at step S13.

As a comparison result of step S13, when the user authentication information received at step S11 and the user authentication information pre-stored in the storage 360 are identical, the controller 350 may determine that the user authentication is completed at step S15, and may proceed to step S17. On the contrary, when the user authentication information received at step S11 and the user authentication information pre-stored in the storage 360 are not identical, the controller 350 may proceed to step S19, and may transmit the authentication information re-request message for the user authentication to the electronic device 100.

At step S17, the controller 350 may activate the checking mode of the rear lamp, and may activate the sound wave sensor mounted on the rear lamp 200.

Figure 4:
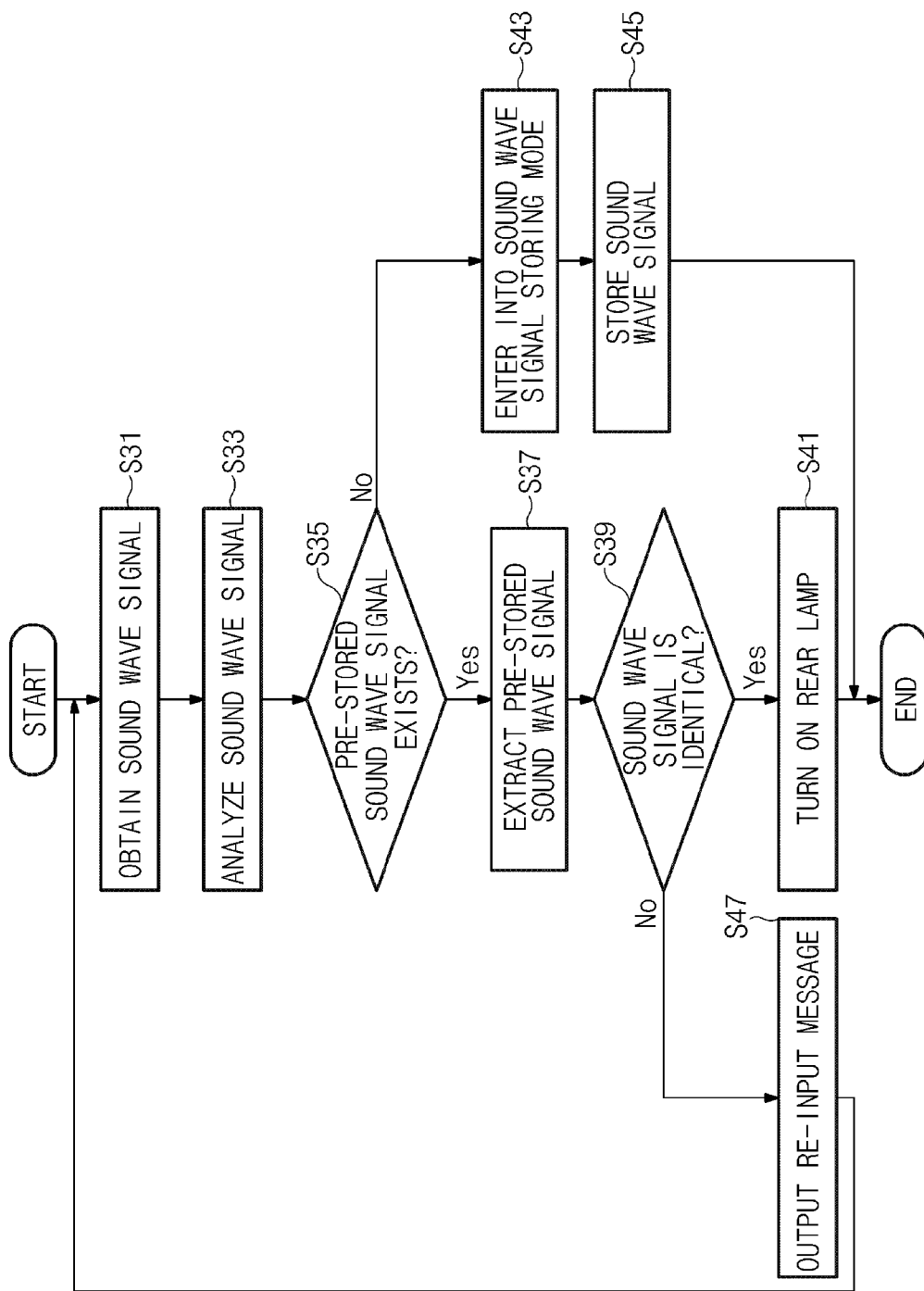
FIG. 4 is a flowchart illustrating a rear lamp checking method according to an embodiment of the present inventive concept.

FIG. 4 is a flow chart illustrating a rear lamp checking method according to an embodiment of the present inventive concept.

Referring to FIGS. 1 to 4, the controller 350 may obtain a first sound wave signal from a sound wave sensor included in the sensor 320 at step S31, and proceeds to step S33. More specifically, when the user taps the rear lamp in which the sound wave sensor is attached, a sound wave such as a sound or a vibration, etc., corresponding to the tapping operation is generated, and the generated sound wave may be propagated through the interior space of the rear lamp 200. In addition, the propagated sound wave may be obtained from the sound wave sensor that is mounted on the rear lamp 200. At this time, the sound wave sensor may be configured with a sensor that may obtain a sound wave signal, such as a piezoelectric sensor, an accelerometer sensor, and a microphone sensor.

At step S33, the controller 350 may analyze the obtained first sound wave signal. The first sound wave signal may be converted into the electric signal in the sensor 320, and the converted electric signal may be converted into a digital signal through the converter 340. The controller 350 may analyze the converted digital signal, and may check information such as a nature of the first sound wave signal, a number of tapping times, and a pattern, etc.

After that, at step 35, the controller 350 may check whether the second sound wave signal exists in the storage 360. As a result of the check at step S35, when the second sound wave signal is stored in the storage 360, the controller 350 may proceed to step S37, and may proceed to step S43 when the second sound wave signal is not stored in the storage 360.

At step S37, the controller 350 may extract the second sound wave signal pre-stored in the storage 360, and may proceed to step S39. At step S39, the controller 350 may compare the information of the first sound wave signal with the information of the second sound wave signal. As a comparison result of step S39, when the information of the first sound wave signal and the information of the second sound wave are identical, the controller 350 may proceed to step S41. On the other hand, the controller 350 may proceed to step S47 when the information of the first sound wave signal and the information of the second sound wave signal are not identical.

At step S41, the controller 350 may control the turning on/off of the rear lamp. More specifically, the controller 350 may control the turning on/off of a back lamp which is equipped on a rear side of the vehicle and turned on when shifting into a reverse gear during a driving, a brake lamp which is turned on when a driver presses a brake pedal, a rear fog lamp which is turned on by an external environment factors such as a fog, a drizzle, and a blizzard, and an indicator lamp which is turned on when changing a lane. As a result, the driver may determine that a problem has occurred in the lamp which is not turned on, and may fix the problem. At this time, according to a type of a first sound wave signal, a type of the rear lamp, turning on/off of which is controlled, may be changed, and turning on of a plurality of lamps may be sequentially performed.

On the contrary, as a comparison result of step S39, when the information of the first sound wave signal and the information of the second sound wave signal are not identical, the controller 350 may proceed to step S47, and may output a re-input request message of the sound wave signal through the output unit (not shown) equipped in the electronic device 100 or in the checking device 300.

In addition, as a result of the check of step S35, when the pre-stored second sound wave signal does not exist in the storage 360, the controller 350 may proceed to step S43 and may enter into the sound wave signal storing mode. At step S45, the controller 350 may store the first sound wave signal obtained at step S31 in the storage 360. At this time, the controller 350 may store the first sound wave signal in the storage 360 as the second sound wave signal, while mapping and storing the type of the rear lamp which controls the turning on/off according to the type of the second sound wave signal when storing a plurality of the second sound wave signals.

The rear lamp checking method as shown in FIG. 4 will be illustrated with the following table 1.

TABLE 1

| first sound wave signal | lamp control |
|---|---|
| •—•— | Turning on back lamp and brake lamp |
| —••— | Turning on rear fog lamp and indicator lamp |

After the completion of the user authentication, when the controller 350 receives the first sound wave signal such as •-•-, e.g., a sequence of four sound waves respectively having short-long-short-long durations, through the sensor 320, the controller may extract the second sound wave signal which is identical to •-•- from the storage 360, and may extract the control signal for the turning on of the back lamp and the brake lamp mapped to the second sound wave signal. The controller 350 may perform the turning on of the back lamp and the brake lamp in accordance with the extracted control signal.

On the contrary, when the second sound wave signal which is identical to the first sound wave signal •-•- is not stored in the storage 360, the controller 350 may enter into a sound wave signal storing mode and may store •-•- as the second sound wave signal, and may generate a control signal to turn on the back lamp and the brake lamp when receiving the first sound wave signal corresponding to •-•- and store in the storage 360 as table 1.

In addition, in table 1, it is illustrated that the type of the lamp is mapped for each sound wave signal, however, it is not limited thereto, and the turning on/off of all rear lamps may be controlled when a single sound wave signal is received.

Accordingly, the present inventive concept may simply check an operation status of the rear lamp which can be checked only during driving, even when not driving by checking turning on of the rear lamp with a simple tapping operation to the rear lamp, so that an accident due to the breakdown of rear lamp can be prevented and convenience of user can be improved.

Likewise, by mounting a sound wave sensor on a rear lamp, and controlling turning on/off of the rear lamp with a tapping operation to the rear lamp by a driver, the present inventive concept may check an operation status of the rear lamp which would be difficult for a driver to check directly in a conventional method.

In addition, by performing a user authentication prior to a check for an operation status of the rear lamp, the present inventive concept may prevent a battery consumption of a vehicle which is generated by anyone other than the driver who taps on the rear lamp to turn on the rear lamp.

Although exemplary embodiments of the present inventive concept have been described in detail hereinabove, it should be clearly understood that many variations and modifications of the basic inventive concepts herein taught which may appear to those skilled in the present art will still fall within the spirit and scope of the present inventive concept, as defined in the appended claims.

What is claimed is:

1. An apparatus for checking a rear lamp, the apparatus comprising:
a sensor disposed in at least one rear lamp and configured to obtain a first sound wave signal corresponding to a tap operation on the at least one rear lamp; and
a controller configured to:
turn on the at least one rear lamp according to the first sound wave signal;
determine whether the second sound wave signal is stored before comparing the first sound wave signal with the pre-stored second sound wave signal;
enter into a signal storing mode if it is determined that the second sound wave signal is not stored; and
store the first sound wave signal received from the sensor as the second sound wave signal,
wherein the controller is configured to perform a user authentication with authentication information received from the outside, complete the user authentication upon determination that user authentication information received from an electronic device and pre-stored authentication information are identical, and activate the sensor by activating a rear lamp checking mode upon completion of the user authentication.

2. The apparatus of claim 1, wherein the controller is configured to turn on the rear lamp upon determination that the first sound wave signal and a pre-stored second sound wave signal are identical.

3. The apparatus of claim 2, wherein the controller is configured to store in a storage, upon determination that no sound wave signal is pre-stored in the storage, the first sound save signal as the second sound wave signal by entering into a signal storing mode.

4. The apparatus of claim 1, further comprising:
a plurality of rear lamps,
wherein the controller is configured to change a type of lamps to be turned on, among the plurality of rear lamps, according to a type of the first sound wave signal.

5. The apparatus of claim 4, wherein the controller is configured to sequentially turn on the plurality of lamps.

6. A method for checking a rear lamp, comprising:
obtaining, from a sensor disposed in at least one rear lamp, a first sound wave signal corresponding to a tap operation on the at least one rear lamp;
turning on the at least one rear lamp according to the first sound wave signal, wherein the turning on of the at least one rear lamp comprises:
comparing the first sound wave signal with a pre-stored second sound wave signal; and
turning on the rear lamp when the first sound wave signal and the second sound wave signal are identical;
completing a user authentication when user authentication information received from the outside and pre-stored authentication information are identical before obtaining the first sound wave signal from the sensor;
activating the sensor by activating a rear lamp checking mode after completing the user authentication;
determining whether the second sound wave signal is stored before comparing the first sound wave signal with the pre-stored second sound wave signal;
entering into a signal storing mode if it is determined that the second sound wave signal is not stored; and
storing the first sound wave signal received from the sensor as the second sound wave signal.

7. The method of claim 6, further comprising:
changing a type of lamps to be turned on, among a plurality of rear lamps, according to a type of the first sound wave signal.

8. The method of claim 7, wherein the plurality of lamps are sequentially turned on.

9. A system for checking a rear lamp, the system comprising:
an electronic device storing user authentication information;
at least one rear lamp including at least one sensor configured to obtain a first sound wave signal corresponding to a tap operation on the at least one rear lamp; and
a checking device configured to perform a user authentication by user authentication information received from the electronic device, and control turning on/off of the rear lamp upon determination that the first sound wave signal obtained from the sensor and a pre-stored second sound wave signal are identical, wherein the electronic device comprises a controller configured to:
  determine whether the second sound wave signal is stored before comparing the first sound wave signal with the pre-stored second sound wave signal;
  enter into a signal storing mode if it is determined that the second sound wave signal is not stored; and
  store the first sound wave signal received from the sensor as the second sound wave signal, and
wherein the checking device is configured to perform a user authentication with authentication information received from the outside, complete the user authentication upon determination that user authentication information received from an electronic device and pre-stored authentication information are identical, and activate the sensor by activating a rear lamp checking mode upon completion of the user authentication.

10. A system for checking a rear lamp, the system comprising:
  a plurality of rear lamps including at least one sensor configured to obtain a first sound wave signal corresponding to a tap operation on one of the plurality of rear lamps which includes the at least one rear lamp; and
  a checking device configured to perform a user authentication by user authentication information inputted through an input, and control turning on/off of at least the one of plurality of the rear lamps upon determination that the first sound wave signal received from the sensor and a pre-stored second sound wave signal are identical; and
  a controller configured to:
    determine whether the second sound wave signal is stored before comparing the first sound wave signal with the pre-stored second sound wave signal;
    enter into a signal storing mode when it is determined that the second sound wave signal is not stored; and
    store the first sound wave signal received from the sensor as the second sound wave signal,
  wherein the checking device is configured to perform a user authentication with authentication information received from the outside, complete the user authentication upon determination that user authentication information received from an electronic device and pre-stored authentication information are identical, and activate the sensor by activating a rear lamp checking mode upon completion of the user authentication.

* * * * *